(12) United States Patent
Bunea et al.

(10) Patent No.: US 12,391,145 B2
(45) Date of Patent: Aug. 19, 2025

(54) ELECTRONIC CONTROL UNIT FOR A VEHICLE WITH GALVANICALLY ISOLATED SUPPLY VOLTAGES ON A SINGLE PRINTED CIRCUIT BOARD

(71) Applicant: Vitesco Technologies Germany GmbH, Hannover (DE)

(72) Inventors: Radu Bunea, Pitesti (RO); Uwe Ulbrich, Obertrubach (DE); Robert Istvan Loerincz, Chisoda (RO); Catalin Purdel, Timisoara (RO); Michael Boehme, Wendelstein (DE); Vlad Catalin Ruxandu, Turda (DE)

(73) Assignee: Vitesco Technologies Germany GmbH, Regensburg (DE)

( * ) Notice: Subject to any disclaimer, the term of this patent is extended or adjusted under 35 U.S.C. 154(b) by 677 days.

(21) Appl. No.: 17/666,048

(22) Filed: Feb. 7, 2022

(65) Prior Publication Data
US 2022/0153167 A1 May 19, 2022

Related U.S. Application Data

(63) Continuation of application No. PCT/EP2020/071607, filed on Jul. 30, 2020.

(30) Foreign Application Priority Data

Aug. 6, 2019 (EP) ...................................... 19465542

(51) Int. Cl.
*B60R 16/00* (2006.01)
*B60L 58/20* (2019.01)
*B60R 16/03* (2006.01)

(52) U.S. Cl.
CPC .............. *B60L 58/20* (2019.02); *B60R 16/03* (2013.01)

(58) Field of Classification Search
USPC ................. 320/106, 107, 108, 109, 110, 112
See application file for complete search history.

(56) References Cited

U.S. PATENT DOCUMENTS

| 2,977,739 A | 4/1961 | Lustyan |
| 2004/0222767 A1 | 11/2004 | Ohkouchi et al. |

(Continued)

FOREIGN PATENT DOCUMENTS

| CN | 104786863 A | 7/2015 |
| CN | 107963040 A | 4/2018 |

(Continued)

OTHER PUBLICATIONS

International Search Report and Written Opinion dated Oct. 2, 2020 from corresponding International Patent Application No. PCT/EP2020/071607.

(Continued)

*Primary Examiner* — Brian Ngo (57) ABSTRACT

The disclosure relates to an electronic control unit (ECU) for a vehicle. The ECU includes a 12V-domain controlling an electric load supplied with a first supply voltage and a 48V-domain controlling an electric load supplied with a second supply voltage. Both domains are arranged on a single printed circuit board (PCB) and are galvanically isolated from each other and connected with each other by a galvanically isolated data interface that transfers data between the domains according to a half-duplex or a full-duplex communication protocol. The 48V-domain includes a 48V-microcontroller and a 48V-power supply supplying the 48V-microcontroller, where the 48V-power supply is powered by the first supply voltage from the 12V-domain via a galvanically isolated supply interface.

10 Claims, 3 Drawing Sheets

(56) References Cited

U.S. PATENT DOCUMENTS

| | | |
|---|---|---|
| 2014/0107902 A1 | 4/2014 | Shiono |
| 2014/0288776 A1 | 9/2014 | Anderson et al. |
| 2015/0175099 A1 | 6/2015 | Puzenat et al. |
| 2016/0144810 A1 * | 5/2016 | Rödel .................... B60R 16/03 307/10.1 |
| 2018/0118048 A1 | 5/2018 | Gibson et al. |
| 2020/0317085 A1 * | 10/2020 | Hofer ..................... B60L 50/66 |

FOREIGN PATENT DOCUMENTS

| | | | |
|---|---|---|---|
| DE | 102017113664 A1 | * | 12/2018 |
| GB | 2519653 A | | 4/2015 |
| JP | 2004336907 A | | 11/2004 |
| JP | 2006300038 A | | 11/2006 |
| JP | 2015530060 A | | 10/2015 |
| JP | 2016516389 A | | 6/2016 |
| WO | 2012172644 A1 | | 2/2015 |
| WO | 2015099537 A1 | | 7/2015 |

OTHER PUBLICATIONS

Chinese Office Action dated Nov. 2, 20238 for corresponding Patent Application No. 202080054922.4.
Japanese Office Action dated Mar. 22, 2023 for corresponding Japanese Patent Application No. 2022-507482.

* cited by examiner

ELECTRONIC CONTROL UNIT FOR A VEHICLE WITH GALVANICALLY ISOLATED SUPPLY VOLTAGES ON A SINGLE PRINTED CIRCUIT BOARD

CROSS-REFERENCE TO RELATED APPLICATIONS

This application claims the benefit of International Application PCT/EP2020/071607, filed Jul. 30, 2020, which claims priority to European Application 19465542.9, filed Aug. 6, 2019. The disclosures of the above applications are incorporated herein by reference.

TECHNICAL FIELD

The disclosure relates to an electronic control unit for a vehicle with galvanically isolated supply voltages on a single printed circuit board.

BACKGROUND

Electrical systems of hybrid cars are powered by a plurality of supply voltages, e.g., by a first supply voltage of 12 Volts and a second supply voltage of 48 Volts. In order to control electric loads supplied with different voltages, such as motors driving actuators, valves or heaters, and in order to verify and control each of the supply voltages, according to the state of the art, a plurality of electronic control units (ECUs) are provided for a hybrid car, where each ECU is dedicated to a single supply voltage.

Also, ECUs that include subsystems or domains dedicated to different supply voltages are known, where these subsystems are coupled for a transfer of digital and/or analog signals.

SUMMARY

The disclosure provides an improved ECU for verifying and/or controlling different supply voltages and for verifying and/or controlling electric loads powered by different supply voltages.

An electronic control unit (ECU) for a vehicle includes a 12V-domain and a 48V-domain. The 12V-domain is designed to control at least one electric load that is supplied with a first supply voltage. Also, the 12V-domain itself is at least in part supplied with the first supply voltage. The 48V-domain is designed to control at least one electric load that is supplied with a second supply voltage. Also, the 48V-domain itself is at least in part supplied with the second supply voltage.

Implementations of the disclosure may include one or more of the following optional features. In some implementations, the first supply voltage is chosen as 12 Volts and the second supply voltage is chosen as 48 Volts.

Both the 12V-domain and the 48V-domain are arranged on a single printed circuit board (PCB). They are galvanically isolated from each other. In some examples, they are galvanically isolated such that they withstand a voltage difference of at least 1 Kilovolt.

Both domains are connected by a data interface that is galvanically isolated and configured for a data transfer according to a half-duplex or a full-duplex communication protocol.

In some examples, the 48V-domain includes a 48V-microcontroller and a 48V-power supply supplying the 48V-microcontroller. The 48V-power supply is powered by the first supply voltage from the 12V-domain via a galvanically isolated supply interface.

Thereby, the 48V-microcontroller may be operated even if the second supply voltage is off. Thus, it is possible to perform diagnostic tests with the 48V-microcontroller to detect failures in the 48V-domain, including failures in the 48V-microcontroller itself, before the second supply voltage is switched on.

Also, the galvanic separation provided by the supply interface is extended onto the 48V-power supply and the 48V-microcontroller and protects these components.

Due to the arrangement of both domains on a single PCB, the footprint and the installation space may be reduced. Also, costs for design, manufacturing and service may be reduced compared to solutions from the state of the art with multiple separate ECUs.

In some examples, the 48V-domain includes a 48V-load control which is designed to verify the status of the second supply voltage and/or a 48V-motor control which is designed to control at least one electric load supplied by the second supply voltage. In this example, the 48V-microcontroller is arranged and configured such as to control the 48V-load control and/or the 48V-motor control.

The control loops for electric loads supplied by the second supply voltage may be advantageously implemented with a particularly low latency, as measurement values and commands need not be transferred between the 12V-domain and the 48V-domain. The same advantage holds true for control loops that verify and/or control the second supply voltage. For example, more stable control loops for electric loads powered by the second supply voltage can be implemented.

In some implementation, the data interface transfers digital data. In this case, all analog signals acquired from or sent to electric loads supplied by the second supply voltage are digitized by the 48V-microcontroller. The digitized values may then be processed by the 48V-microcontroller and/or transferred via the digital data interface between the 48V-microcontroller and the 12V-microcontroller.

Digital data may be transferred by serial busses or protocols which require less wires or lines, thereby relieving the technical burden for the isolation of the data interface. Furthermore, digital data is less sensitive against electromagnetic interferences and does not require precise reference voltages for analog-to-digital conversion (ADC). This improves the robustness and the accuracy of data transferred along the data interface and prevents data loss as no conversion of analog signals is necessary.

In some examples, the data interface is configured to support a controller area network (CAN) protocol and/or a serial peripheral interface (SPI) protocol and/or an inter-integrated circuit (I2C) protocol. Such protocols are well-known and may be implemented by available components and circuitry, thereby reducing the design and manufacturing burden.

In some implementations, the supply interface includes a flyback converter. Flyback converters are well-known and readily available components for directed-current (DC/DC) conversion of voltages, that provide a good galvanic separation between the input and the output.

In some implementations, the first supply voltage is 12 Volts and the second supply voltage is 48 Volts, where electric loads with relatively high power consumption, such as heaters or high power pump motors, are supplied with 48 Volts, and electric loads with relatively low power consumption, such as valves or gear selection motors, are supplied with 12 Volts. Thereby, the overall power consumption can be optimised.

In some examples, the 48V-microcontroller is configured to perform a power-on-test of the 48V-domain upon switching on the first supply voltage. By an external switching regime it is possible to switch on the first supply voltage before the second supply voltage is switched on. When a failure is detected by the 48V-microcontroller during the power-on-test, the switching of the second supply voltage can be prevented and the ECU can be brought into a failsafe state. Thereby, safety and protection of the ECU and of components controlled by the ECU can be improved.

In some examples, the 12V-domain includes a 12V-microcontroller which is connected via the data interface with the 48V-microcontroller. The 12V-microcontroller is configured as a master and the 48V-microcontroller is configured as a slave. When the first supply voltage is powered on, the 12V-microcontroller can perform a power-on-test of the 12V-domain. As it operates as a master, the 12V-microcontroller can be configured such as to enable the second supply voltage and/or to pass control to the 48V-microcontroller only when the power-on-test of the 12V-domain shows no failure. Thereby, safety and protection of the ECU and of components controlled by the ECU can be improved.

In some implementations, the 12V-domain includes a 12V-load control designed to verify the status of the first supply voltage and/or a 12V-motor control designed to control at least one electric load supplied by the first supply voltage. The 12V-microcontroller is arranged and configured such as to control the 12V-load control and/or the 48V-motor control.

The control loops for electric loads supplied by the first supply voltage may be advantageously implemented with a low latency, as measurement values and commands need not be transferred between the 12V-domain and the 48V-domain. The same advantage holds true for control loops that verify and/or control the first supply voltage. For example, more stable control loops for electric loads powered by the first supply voltage can be implemented by this example of the disclosure.

In some examples, the 12V-domain includes a 12V-CAN controller designed to transfer data via a CAN bus and connected with the 12V-microcontroller. Thereby, the 12V-domain can be controlled via the CAN bus and can exchange data and commands with other control units of the vehicle connected with the CAN bus. Also, via the data interface, the 48V-domain may communicate over the CAN bus. As the CAN bus is a frequently used communication standard in vehicles, this example improves the compatibility of the ECU.

In some examples, the 12V-microcontroller is configured to perform operations that are relevant for the safety of the vehicle and the 48V-microcontroller is configured to perform operations that are not relevant for the safety of the vehicle. Thereby, the overall effort for risk-control measures can be reduced and the reliability of the ECU can be improved.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
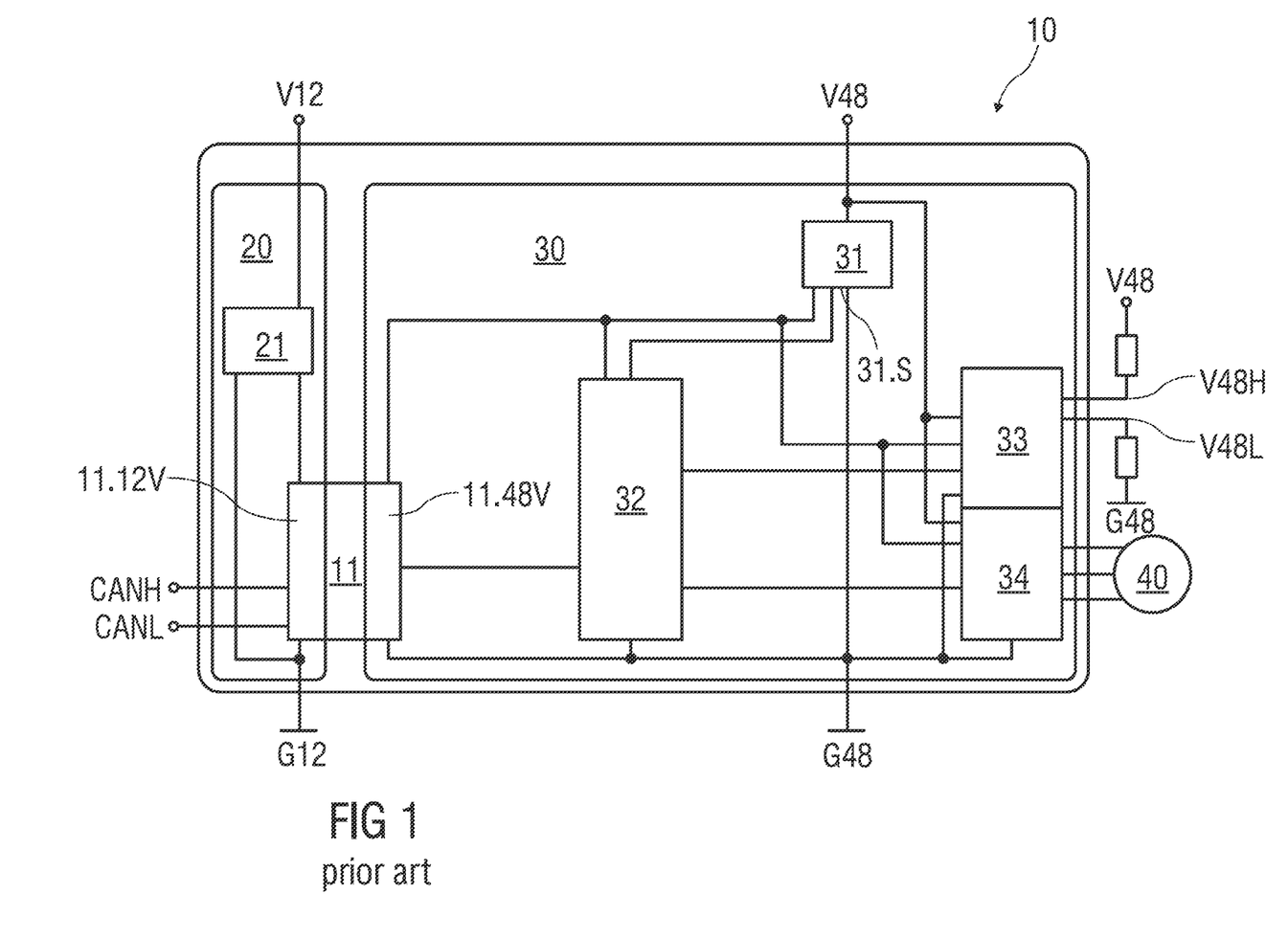
FIG. 1 shows an electronic schematic design of a hybrid electronic control unit with an isolated CAN node according to the state of the art.

FIG. 1 shows an electronic schematic design of a hybrid electronic control unit (ECU) 10 being used in hybrid cars according to the state of the art. The ECU 10 is implemented on a single printed circuit board (PCB) that includes a 12V-domain 20 and a 48V-domain 30 which are galvanically isolated from each other.

The 12V-domain 20 is electrically supplied by a 12V-supply voltage V12 of 12 Volts and by a 12V-ground G12. The 48V-domain 30 is electrically supplied by a 48V-supply voltage V48 of 48 Volts and by a 48V-ground G48. According to the state of the art, the 12V-supply voltage V12 is switched on before the 48V-supply voltage V48.

The 12V-domain 20 is formed as a Controller Area Network (CAN) node. It provides a first CAN pin CANH and a second CAN pin CANL that are connectable with an external two-wire CAN bus. CAN busses are well-known for data transfer between control units of a vehicle.

The ECU 10 includes a data interface 11 that is designed to transfer data between the CAN pins CANL, CANH of the 12V-domain 20 and the 48V-domain 30. The data interface 11 has a 12 Volts side 11.12V connected with the 12V-domain 20 and a 48 Volts side 11.48V connected with the 48V-domain 30. Both sides 11.12V, 11.48V of the data interface 11 are galvanically isolated from each other. In the example shown in FIG. 1, both sides 11.12V, 11.48V of the data interface 11 are designed and configured to support the CAN protocol, thus forming a serial CAN interface between the 12V-domain 20 and the 48V-domain 30.

The 12V-domain 20 includes a 12V-power supply 21 that electrically supplies the 12 Volts side 11.12V of the data interface 11. The 12V-power supply 21 is powered by the 12V-supply voltage V12.

The 48V-domain 30 includes a 48V-power supply 31 that electrically supplies the 48 Volts side 11.48V of the data interface 11. The 48V-power supply 31 is powered by the 48V-supply voltage V48. The 48V-power supply 31 has a 48V-power status pin 31.S that indicates the status of the 48V-power supply 31.

The power supplies 21, 31 provide a voltage of 5 Volts to power each side 11.12V, 11.48V of the data interface 11.

The 48V-domain 30 further includes a 48V-microcontroller 32, a 48V-load control 33 and a 48V-motor control 34.

The 48V-load control 33 is powered by the 48V-supply voltage V48 and is designed to control and/or verify the load status of the externally provided voltage of 48 Volts via a first and a second probe pin V48H, V48L. The probe pins V48H, V48L are connected with the 48V-supply voltage V48 and the 48V-ground G48, respectively, via external measurement resistors.

The 48V-motor control 34 is powered by the 48V-supply voltage V48 and is designed to control an external brushless directed current (BLDC) motor 40. The BLDC motor 40 may be formed as an actuator, such as a high-power pump motor.

In some examples, the 48V-domain 30 may include further controllers powered by the 48V-supply voltage V48 and designed to control external electrical loads, such as heaters. Also, controllers that control more than one external electrical load are known from the state of the art.

The 48V-microcontroller 32 is powered by the 48V-power supply 31. As an example, the 48V-microcontroller 32 is supplied with a voltage of 5 Volts provided by the 48V-power supply 31.

The 48V-microcontroller 32 is connected with the 48 Volts side 11.48V of the data interface 11, with the 48V-power status pin 31.S of the 48V-power supply 31, with the 48V-load control 33 and with the 48V-motor control 34 such that it may transfer data, for example status information, acquired measurements or control signals, with the data interface 11, the 48V-power supply 31, the 48V-load control 33 and the 48V-motor control 34. Said connections may be formed as multi-wire connections.

In particularity, the 48V-microcontroller 32 is configured to receive instructions via the data interface 11 and translate such instructions into control signals controlling the 48V-motor control 34. The 48V-microcontroller 32 is furthermore configured to retrieve diagnostic data, such a status data from the 48V-power supply 31, from the 48V-load control 33 and/or from the 48V-motor control 34, and to transfer such diagnostic data via the data interface 11 to the CAN pins CANL, CANH and thus to the external CAN bus. The 48V-microcontroller 32 may also be configured to run software that implements a control loop controlling peripheral components such as one or more BLDC motors 40, heaters or other actuators supplied by the 48V-supply voltage V48.

From the state of the art, examples are known where the 12V-domain 20 includes a CAN controller arranged in between the CAN pins CANL, CANH and the 12V-side 11.12V of the data interface 11.

Figure 2:
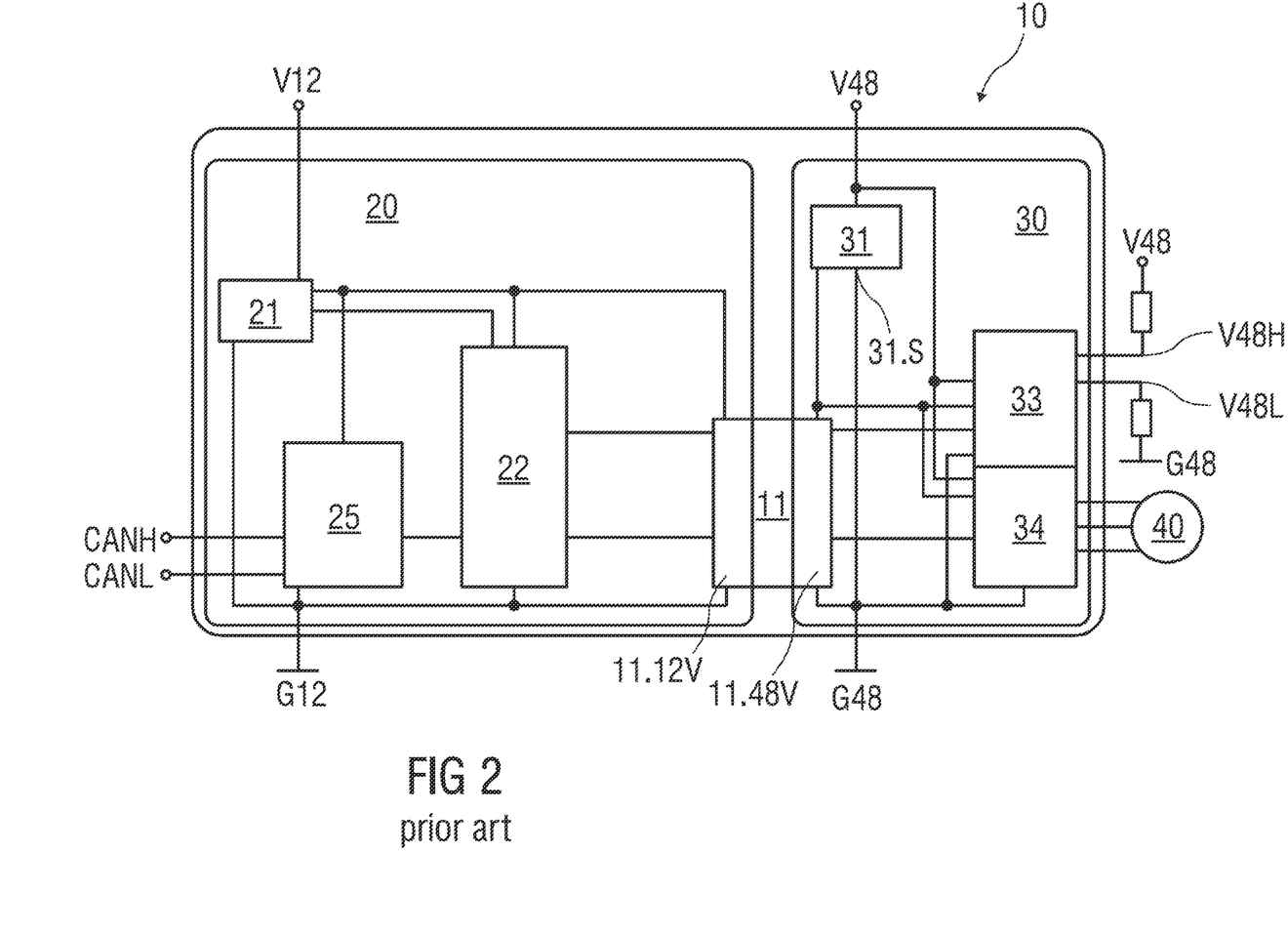
FIG. 2 shows an electronic schematic design of a hybrid electronic control unit with an isolated microcontroller according to the state of the art.

Also, examples are known, where the 12V-domain 20 includes a 12V-microcontroller 22, yet where the 48V-domain 30 does not include the 48V-microcontroller 32, as shown in FIG. 2. In such an example, data such as status information, acquired measurements or control signals is transferred between the 12V-microcontroller 22 and various components of the 48V-domain 30, such as the 48V-power supply 31, the 48V-load control 33 and the 48V-motor control 34, via the data interface 11. To provide access to an external CAN bus for the 12V-microcontroller 22, such an example may also include a 12V-CAN controller 25 arranged in between the CAN pins CANH, CANL and the 12V-microcontroller 22.

Therefore, it is not sufficient in those examples to form the data interface 11 as serial interface such as a CAN interface. Rather, the data interface 11 is designed for the parallel transfer of multiple digital and/or analog signals. Of course, in order to maintain the galvanic isolation of the domains 20, 30, each of the signal lines of the data interface 11 has to be designed for galvanic separation.

In yet a further example known from the state of the art, the 48V-motor control 34 is substituted by a controller that is implemented in the 12V-domain 20 and a power circuitry having power transistors that is implemented in the 48V-domain 30. Such an example requires additional signal lines along the data interface 11 controlling the gate voltages of the power transistors. In an example, the controlling of the gate voltages precisely and the conformance of electromagnetic compatibility raise an additional technical burden.

Also, examples are known from the state of the art, where a 12V-load control 23 is implemented in the 12V-domain 20, which is configured to control and/or verify the status of the 12V-supply voltage V12.

Figure 3:
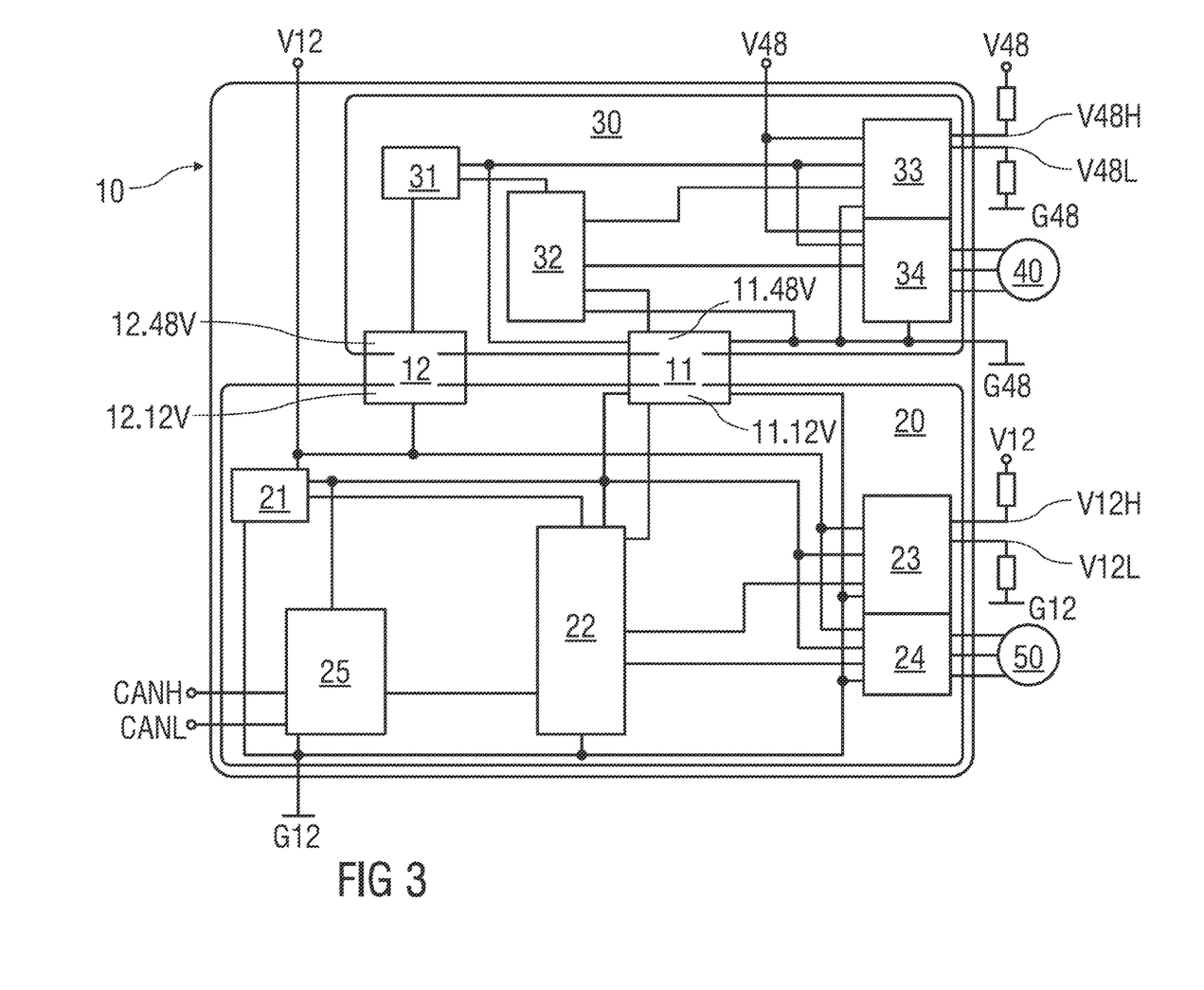
FIG. 3 shows an exemplary electronic schematic design of a hybrid electronic control unit with a 48 Volts domain galvanically isolated from and partly powered by a 12 Volts domain.

FIG. 3 schematically shows an exemplary ECU with a 12V-domain 20 and a 48V-domain 30 that are arranged on the same PCB.

The 12V-domain 20 is electrically supplied by a 12V-supply voltage V12 of 12 Volts and by a 12V-ground G12. The 48V-domain 30 is electrically supplied by a 48V-supply voltage V48 of 48 Volts and by a 48V-ground G48.

The 12V-domain 20 is formed as a Controller Area Network (CAN) node. It provides a first CAN pin CANH and a second CAN pin CANL that are connectable with an external two-wire CAN bus.

The ECU 10 includes a data interface 11 that is designed to transfer data between the 12V-domain 20 and the 48V-domain 30. The data interface 11 has a 12 Volts side 11.12V connected with the 12V-domain 20 and a 48 Volts side 11.48V connected with the 48V-domain 30. Both sides 11.12V, 11.48V of the data interface 11 are galvanically isolated from each other such that this isolation withstands a voltage of at least 1 Kilovolt.

In an example, the data interface 11 is configured according to standardized full or half duplex communication protocols for digital data such as CAN or serial peripheral interface (SPI). In an example, the data interface 11 and the domains 20, 30 are configured such that the 12V-domain 20 acts as a master whereas the 48V-domain 30 acts as a slave.

The data interface 11 includes a plurality of data lines designed to transmit digitized data between the 12V-domain 20 and the 48V-domain 30. Each of the data lines is galvanically isolated in order to maintain the galvanic separation between both sides 11.12V, 11.48V of the data interface 11.

The 12V-domain 20 includes a 12V-power supply 21 that electrically supplies the 12 Volts side 11.12V of the data interface 11. The 12V-power supply 21 is powered by the 12V-supply voltage V12.

The 48V-domain 30 includes a 48V-power supply 31 that electrically supplies the 48 Volts side 11.48V of the data interface 11. According to the disclosure, the 48V-power supply 31 is powered via a supply interface 12 arranged in between the 12V-domain 20 and the 48V-domain 30.

The supply interface 12 has a 12 Volts side 12.12V connected with the 12V-domain 20 and a 48 Volts side 12.48V connected with the 48V-domain 30. Both sides 12.12V, 12.48V of the supply interface 12 are galvanically isolated from each other.

On its 12 Volts side 12.12V, the supply interface 12 is connected with the 12 Volts power line and thus with the 12V-supply voltage of 12 Volts.

On its 48 Volts side 12.48V, the supply interface 12 is connected with and supplying the 48V-power supply 31.

In an example, the supply interface 12 may be formed as a flyback converter. But also other examples of DC/DC converters known from the state of the art that provide galvanic separation of the input from the output may be used.

The 48V-power supply 31 has a 48V-power status pin 31.S that indicates the status of the 48V-power supply 31.

The power supplies 21, 31 provide a voltage of 5 Volts to power each side 11.12V, 11.48V of the data interface 11.

The 48V-domain 30 further includes a 48V-microcontroller 32, a 48V-load control 33 and a 48V-motor control 34.

The 48V-load control 33 is powered by the 48V-supply voltage V48 and is designed to control and/or verify the load status of the externally provided voltage of 48 Volts via a first and a second probe pin V48H, V48L. The probe pins V48H, V48L are connected with the 48V-supply voltage V48 and the 48V-ground G48, respectively, via external measurement resistors.

The 48V-motor control 34 is powered by the 48V-supply voltage V48 and is designed to control an external brushless directed current (BLDC) motor 40. The BLDC motor 40 may be formed as an actuator, such as a high-power pump motor.

In some implementations, the 48V-domain 30 may include further controllers powered by the 48V-supply voltage V48 and designed to control external electrical loads, such as heaters. Also, controllers that control more than one external electrical load are known from the state of the art.

The 48V-microcontroller 32 is powered by the 48V-power supply 31. As an example, the 48V-microcontroller 32 is supplied with a voltage of 5 Volts provided by the 48V-power supply 31.

The 48V-microcontroller 32 is connected with the 48 Volts side 11.48V of the data interface 11, with the 48V-power status pin 31.S of the 48V-power supply 31, with the 48V-load control 33 and with the 48V-motor control 34 such that it may transfer data, for example status information, acquired measurements or control signals, with the data interface 11, the 48V-power supply 31, the 48V-load control 33 and the 48V-motor control 34. The connections may be formed as multi-wire connections and may be designed to carry digital and/or analog signals.

The 48V-microcontroller 32 is configured to receive instructions via the data interface 11 and translate such instructions into control signals controlling the 48V-motor control 34. The 48V-microcontroller 32 also retrieves diagnostic data, such as status data from the 48V-power supply 31, from the 48V-load control 33 and/or from the 48V-motor control 34, and to transfer such diagnostic data via the data interface 11 to the 12V-domain 20. The 48V-microcontroller 32 may also be configured to run software that implements a control loop controlling peripheral components such as one or more BLDC motors 40, heaters or other actuators supplied by the 48V-supply voltage V48.

The 12V-domain 20 includes 12V-microcontroller 22 that is supplied by the 12V-power supply 21 as known from the state of the art. Furthermore, the 12V-domain 20 includes a 12V-load control 23, a 12V-motor control 24 and a 12V-CAN controller 25.

The 12V-CAN controller 25 is supplied with a 5 Volts output voltage of the 12V-power supply 21 and is connected with the CAN pins CANH, CANL. The 12V-CAN controller 25 is further connected with the 12V-microcontroller 22. The 12V-CAN controller 25 is configured to drive an external CAN bus if connected with the CAN pins CANH, CANL and to transfer data between such CAN bus and the 12V-microcontroller 22.

The 12V-load control 23 is powered by the 12V-supply voltage V12 and is designed to control and/or verify the load status of the externally provided voltage of 12 Volts via a first and a second probe pin V12H, V12L. The probe pins V12H, V12L are connected with the 12V-supply voltage V12 and the 12V-ground G12, respectively, via external measurement resistors.

The 12V-motor control 24 is powered by the 12V-supply voltage V12 and is designed to control an external load such as a low-power brushless directed current (BLDC) motor 50. The low-power BLDC motor 50 may be formed as an actuator, for example a gear selection motor or a valve.

In general, first loads with relatively low power consumption are driven by the 12V-domain 20, whereas actuators with relatively (in comparison to said first loads) high power consumption are driven by the 48V-domain 30 in order to optimize the power consumption.

In some examples, the 12V-domain 20 may include further controllers powered by the 12V-supply voltage V12 and designed to control external electrical loads, such as heaters. Also, controllers that control more than one external electrical load are known from the state of the art.

The 12V-microcontroller 22 is connected with the 12 Volts side 11.12V of the data interface 11, with the 48V-power status pin 31.S of the 12V-power supply 21, with the 12V-load control 23 and with the 12V-motor control 24 such that it may transfer data, for example status information, acquired measurements or control signals, with the data interface 11, the 12V-power supply 21, the 12V-load control 23 and the 12V-motor control 24. The connections may be formed as multi-wire connections and may be designed to carry digital and/or analog signals.

In particularity, the 12V-microcontroller 22 is configured to receive instructions via the 12V-CAN controller 25 from an external CAN bus, if connected, and to translate such instructions into control signals controlling the 12V-motor control 24.

The 12V-microcontroller 22 furthermore translates instructions received from the 12V-CAN controller 25 into signals, such as digital signals, that are passed to the data interface 11 and further on to the 48V-microcontroller 32. Thus, it is possible to control, via the 12V-CAN controller 25, the 12V-microcontroller 22 and the data interface 11, the 48V-microcontroller 32 from the external CAN bus connected to the CAN pins CANH, CANL.

The 12V-microcontroller 22 is furthermore configured to receive signals, preferably digital signals, sent from the 48V-microcontroller 32 via the data interface 11. Thus it is possible to run a software program on the 48V-microcontroller 32 that retrieves data, such as diagnostic load control data or diagnostic motor control data from controls 33, 34 of the 48V-domain 30, pre-process and evaluate such data and transfer the result of such pre-processing or evaluation via the data interface 11 to the 12V-microcontroller 22 and further on to the external CAN bus.

As an advantage, it is possible to implement control loops controlling controls 33, 34 and other peripherals of the 48V-domain 30 with tight timing restrictions in the software running on the 48V-microcontroller 32, whereas less time sensitive operations can be programmed into the software running on the 12V-microcontroller 22 or on an external processing device connected with the ECU 10 via a CAN bus. This enables a lower latency and thus an improved stability for control loops controlling periphery of the 48V-domain 30

Whereas in general it is thus possible to assign software functionality to either of the microcontrollers 22, 32 arbitrarily, in some examples all safety relevant functions are assigned to the 12V-microcontroller 22 and the microcontrollers 22, 32 are configured such that the 12V-microcontroller 22 acts as a leading system (master) and the 48V-microcontroller 32 acts as a following system (slave) in the communication along the data interface 11.

As a further advantage, it is possible to digitize data such as measurement data in the 48V-domain 30, for example a voltage probed by the 48V-load control 33, by the 48V-microcontroller 32. In addition or alternatively, it is possible to convert digital data passed via the data interface 11 into analog values by the 48V-microcontroller 32. Thereby, the data interface 11 can be relieved of the requirement of transferring analog signals. This improves the accuracy and robustness of the transfer of values between the domains 20, 30. This can also improve the electromagnetic compatibility (EMC) of the ECU 10 or relieve technical measure to fulfil EMC requirements.

The 12V-microcontroller 22 is furthermore configured to retrieve diagnostic data, such as status data from the 12V-power supply 21, from the 12V-load control 23 and/or from the 12V-motor control 24, and to transfer such diagnostic data via the 12V-CAN controller 25 to the outside CAN bus. The 12V-microcontroller 22 may also be configured to run software that implements a control loop controlling peripheral components such as one or more low-power BLDC motors 50 or other actuators supplied by the 12V-supply voltage V12.

As yet a further advantage of the ECU 10 according to FIG. 3, the 48V-power supply 31 and the 48V-microcontroller 32 are powered on as soon as the 12V-supply voltage V12 is available. Thereby, diagnostic tests such as a power-on self-test (POST) of the 48V-microcontroller 32 can be run before the 48V-supply voltage V48 is switched on and, in case of a failure detected by a test, the switching on of the 48V-supply voltage V48 can be prevented and the entire ECU 10 can be brought into a failsafe state. Thereby the reliability of the ECU 10 is improved.

A number of implementations have been described. Nevertheless, it will be understood that various modifications may be made without departing from the spirit and scope of the disclosure. Accordingly, other implementations are within the scope of the following claims.

LIST OF REFERENCE SIGNS 10 electronic control unit (ECU)
11 data interface
11.12 V12 Volts side
11.48 V48 Volts side
12 supply interface
12.12 V12 Volts side
12.48 V48 Volts side
20 12V-domain
21 12V-power supply
22 12V-microcontroller
23 12V-load control
24 12V-motor control
25 12V-CAN controller
30 48V-domain
31 48V-power supply
31.S 48V-power status pin
32 48V-microcontroller
33 48V-load control
34 48V-motor control
40 brushless directed current (BLDC) motor
50 low-power BLDC motor
CANH first CAN pin
CANL second CAN pin
G12 12V-ground
G48 48V-ground
V12 12V-supply voltage, first supply voltage
V48 48V-supply voltage, second supply voltage
V48H first probe pin
V48L second probe pin
V12H first probe pin
V12L second probe pin

What is claimed is:

1. An electronic control unit (ECU) for a vehicle, the electronic control unit comprising:
   a 12V-domain designed to control an electric load supplied with a first supply voltage;
   a 48V-domain designed to control an electric load supplied with a second supply voltage, the 12V-domain and the 48V-domain are arranged on a single printed circuit board (PCB), the 48V-domain comprises:
      a 48V-microcontroller; and
      a 48V-power supply supplying the 48V-microcontroller; and
   a galvanically isolated data interface designed to transfer data between the domains according to a half-duplex or a full-duplex communication protocol, the galvanically isolated data interface galvanically isolates the 12V-domain and the 48V-domain from each other and connects the 12V-domain and the 48V-domain with each other;
   wherein the 48V-power supply is powered by the first supply voltage from the 12V-domain via a galvanically isolated supply interface, and
   wherein the 48V-domain comprises a 48V-load control designed to verify a status of the second supply voltage and/or a 48V-motor control designed to control at least one electric load supplied by the second supply voltage, wherein the 48V-microcontroller is arranged and configured such as to control the 48V-load control and/or the 48V-motor control.

2. The electronic control unit of claim 1, wherein the data interface transfers digital data.

3. The electronic control unit of claim 1, wherein the supply interface comprises a flyback converter.

4. The electronic control unit of claim 3, wherein the data interface supports a controller area network (CAN) protocol and/or a serial peripheral interface (SPI) protocol and/or an inter-integrated circuit (I2C) protocol.

5. The electronic control unit of claim 1, wherein the first supply voltage is 12 Volts and the second supply voltage is 48 Volts.

6. An electronic control unit (ECU) for a vehicle, the electronic control unit comprising:
   a 12V-domain designed to control an electric load supplied with a first supply voltage;
   a 48V-domain designed to control an electric load supplied with a second supply voltage, the 12V-domain and the 48V-domain are arranged on a single printed circuit board (PCB), the 48V-domain comprises:
      a 48V-microcontroller; and
      a 48V-power supply supplying the 48V-microcontroller; and
   a galvanically isolated data interface designed to transfer data between the domains according to a half-duplex or a full-duplex communication protocol, the galvanically isolated data interface galvanically isolates the 12V-domain and the 48V-domain from each other and connects the 12V-domain and the 48V-domain with each other;
   wherein the 48V-power supply is powered by the first supply voltage from the 12V-domain via a galvanically isolated supply interface, and
   wherein the 48V-microcontroller performs a power-on-test of the 48V-domain upon switching on the first supply voltage.

7. An electronic control unit (ECU) for a vehicle, the electronic control unit comprising:
- a 12V-domain designed to control an electric load supplied with a first supply voltage;
- a 48V-domain designed to control an electric load supplied with a second supply voltage, the 12V-domain and the 48V-domain are arranged on a single printed circuit board (PCB), the 48V-domain comprises:
  - a 48V-microcontroller; and
  - a 48V-power supply supplying the 48V-microcontroller; and
- a galvanically isolated data interface designed to transfer data between the domains according to a half-duplex or a full-duplex communication protocol, isolates the 12V-domain and the 48V-domain from each other and connects the 12V-domain and the 48V-domain with each other;
- wherein the 48V-power supply is powered by the first supply voltage from the 12V-domain via a galvanically isolated supply interface, and
- wherein the 12V-domain comprises a 12V-microcontroller connected via the data interface with the 48V-microcontroller, wherein the 12V-microcontroller is configured as a master and the 48V-microcontroller is configured as a slave.

8. The electronic control unit of claim 7, wherein the 12V-domain comprises a 12V-load control designed to verify a status of the first supply voltage and/or a 12V-motor control designed to control at least one electric load supplied by the first supply voltage, wherein the 12V-microcontroller is arranged and configured such as to control the 12V-load control and/or the 12V-motor control.

9. The electronic control unit of claim 7, wherein the 12V-domain comprises a 12V-CAN controller connected with the 12V-microcontroller.

10. The electronic control unit of claim 7, wherein the 12V-microcontroller performs operations that are relevant for the safety of the vehicle and the 48V-microcontroller performs operations that are not relevant for the safety of the vehicle.

* * * * *